US008835210B2

(12) United States Patent
Nakai et al.

(10) Patent No.: US 8,835,210 B2
(45) Date of Patent: Sep. 16, 2014

(54) MANUFACTURING METHOD FOR SOLAR CELL

(71) Applicant: Sanyo Electric Co., Ltd., Moriguchi (JP)

(72) Inventors: Takuo Nakai, Osaka (JP); Naoki Yoshimura, Kaizuka (JP); Masaki Shima, Uji (JP)

(73) Assignee: Sanyo Electric Co., Ltd., Moriguchi (JP)

( * ) Notice: Subject to any disclaimer, the term of this patent is extended or adjusted under 35 U.S.C. 154(b) by 0 days.

(21) Appl. No.: 14/091,983

(22) Filed: Nov. 27, 2013

(65) Prior Publication Data
US 2014/0080246 A1 Mar. 20, 2014

Related U.S. Application Data

(63) Continuation of application No. PCT/JP2012/063312, filed on May 24, 2012.

(30) Foreign Application Priority Data

Jun. 3, 2011 (JP) .................................. 2011-124936

(51) Int. Cl.
H01L 21/00 (2006.01)
H01L 21/302 (2006.01)
H01L 21/461 (2006.01)
H01L 31/0236 (2006.01)

(52) U.S. Cl.
CPC ........... *H01L 31/02363* (2013.01); *Y02E 10/50* (2013.01)
USPC ............. 438/71; 438/705; 438/734; 438/750; 257/E21.214

(58) Field of Classification Search
CPC ..................... H01L 21/02019; H01L 21/0203; H01L 21/02035; H01L 21/302; H01L 21/30604; H01L 21/30612; H01L 21/30617; H01L 31/0236; H01L 31/02363; H01L 31/02366; H01L 29/30; H01L 33/22
USPC .......................... 438/71, 705, 734, 749, 750; 257/E21.214–E21.223, E25.004
See application file for complete search history.

(56) References Cited

U.S. PATENT DOCUMENTS

| 6,380,479 B2 | 4/2002 | Nakai et al. |
| 6,391,145 B1* | 5/2002 | Nishimoto et al. ...... 156/345.12 |
| 2012/0006790 A1* | 1/2012 | Komori et al. .................. 216/93 |
| 2012/0160296 A1* | 6/2012 | Laparra et al. ................ 136/244 |

FOREIGN PATENT DOCUMENTS

| JP | H11-220146 A | 8/1999 |
| WO | 98/43304 A1 | 10/1998 |

* cited by examiner

*Primary Examiner* — Calvin Choi
(74) *Attorney, Agent, or Firm* — Marvin A. Motsenbocker; Mots Law, PLLC

(57) ABSTRACT

The present invention reduces the time required to manufacture a solar cell. After etching main surfaces (10B1, 10B2) of a crystalline silicon substrate (10B) using one etching solution, the main surfaces (10B1, 10B2) of the crystalline silicon substrate (10B) are etched at a lower etching rate than the etching performed using the one etching solution by using another etching solution that has a higher concentration of etching components than the one etching solution. In this way, a textured structure is formed in the main surfaces (10B1, 10B2) of the crystalline silicon substrate (10B).

10 Claims, 4 Drawing Sheets

MANUFACTURING METHOD FOR SOLAR CELL

CROSS-REFERENCE TO RELATED APPLICATIONS

This is a continuation of International Application PCT/JP2012/063312, with an international filing date of May 24, 2012, filed by applicant, the disclosure of which is hereby incorporated by reference in its entirety.

FIELD OF THE INVENTION

The present invention relates to a manufacturing method for a solar cell. More specifically, the present invention relates to a manufacturing method for a solar cell including a crystalline silicon substrate having a main surface in which a textured structure has been formed.

BACKGROUND

Interest in solar cells has increased in recent years as an energy source with a low environmental impact.

Patent Document 1 and Patent Document 2 describe crystalline silicon solar cells using a crystalline silicon substrate. In the crystalline silicon solar cells described in Patent Document 1 and Patent Document 2, an uneven structure referred to as a textured structure is formed on the surface of the crystalline silicon substrate to increase the incident efficiency of the light on the crystalline silicon substrate.

Patent Document 2 describes the following method of forming a textured structure in a single-crystal silicon substrate. In the first step, the single-crystal silicon substrate is immersed in a 5 mass % sodium hydroxide aqueous solution for ten minutes at approximately 85° C. The first step removes the processing strain on the surface of the single-crystal silicon substrate. In the second step, anisotropic etching is performed on the surface of the single-crystal silicon using an aqueous solution containing approximately 2 mass % sodium hydroxide and isopropyl alcohol. Here, the concentration of sodium hydroxide is lower than in the first step. In the second step, a pyramidal textured structure is formed on the surface of the single-crystal silicon substrate. In other words, in Patent Document 2, a textured structure is formed by performing isotropic etching using an etching solution containing a relatively high concentration of etchant, and then performing anisotropic etching using an etching solution containing a relatively low concentration of etchant.

PRIOR ART DOCUMENTS

Patent Documents

Patent Document 1: Laid-Open Patent Publication No. 11-220146

Patent Document 2: PCT Laid-Open Patent Publication No. WO98/43304

SUMMARY

Problem Solved by the Invention

A precisely shaped textured structure cannot be formed in a short period of time using the textured structure forming method described in Patent Document 2. As a result, it takes longer to manufacture a solar cell.

In view of this situation, it is a purpose of the present invention to reduce the time required to manufacture a solar cell.

Means of Solving the Problem

The present invention is a manufacturing method for a solar cell including a crystalline silicon substrate having a main surface in which a textured structure has been formed. In the manufacturing method for a solar cell in the present invention, the textured structure is formed on the main surface of the crystalline silicon substrate by etching the main surface of the crystalline silicon substrate using one etching solution, and then etching the main surface of the crystalline silicon substrate at a lower etching rate than the etching performed using the one etching solution by using another etching solution having a higher concentration of etching components than the one etching solution.

Effect of the Invention

The present invention is able to reduce the time required to manufacture a solar cell.

DETAILED DESCRIPTION

Figure 1:
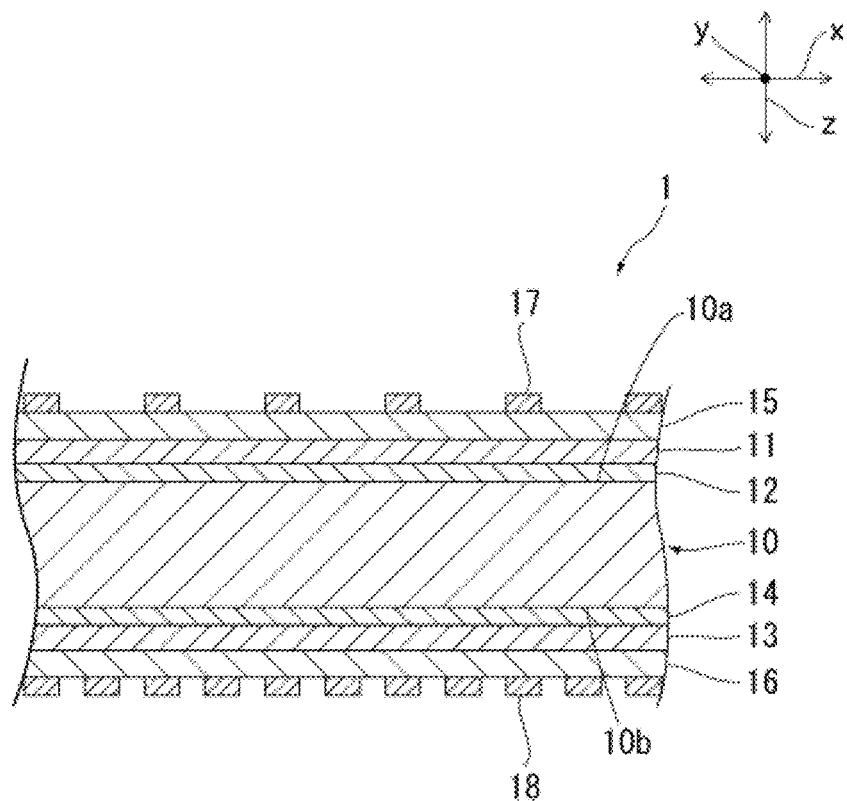
FIG. 1 is a cross-sectional view of a solar cell manufactured in a first embodiment.

The following is an explanation of an example of a preferred embodiment of the present invention. The following embodiment is merely an example. The present invention is not limited to the following embodiment in any way.

Further, in each of the drawings referenced in the embodiment, members having substantially the same function are denoted by the same symbols. The drawings referenced in the embodiment are also depicted schematically. The dimensional ratios of the objects depicted in the drawings may differ from those of the actual objects. The dimensional ratios of objects may also vary between drawings. The specific dimensional ratios of the objects should be determined with reference to the following explanation.

1st Embodiment

Configuration of Solar Cell 1

FIG. 1 is a cross-sectional view of a solar cell manufactured in a first embodiment. The configuration of the solar cell manufactured in this embodiment will be explained first with reference to FIG. 1.

The solar cell 1 includes a crystalline silicon substrate 10. The crystalline silicon substrate 10 can be a single-crystal silicon substrate or a polycrystalline silicon substrate.

In the explanation of present embodiment, the conductive type of the crystalline silicon substrate 10 is n-type. However, the present invention is not limited to this. The conductive type of the crystalline silicon substrate 10 can be p-type.

A p-type semiconductor layer 11 with a different type of conductivity from the crystalline silicon substrate 10 is arranged on the first main surface 10a of the crystalline silicon substrate 10. The p-type semiconductor layer 11 can be made of a p-type amorphous silicon layer. The p-type semiconductor layer 11 preferably contains hydrogen. The thickness of the p-type semiconductor layer 11 can be from 3 nm to 20 nm, and is preferably from 5 nm to 15 nm. The amorphous silicon is a material of a non-crystalline silicon semiconductor material series, and includes the microcrystalline silicon.

A substantially intrinsic semiconductor layer 12 is arranged between the first main surface 10a of the crystalline silicon substrate 10 and the p-type semiconductor layer 11. The substantially intrinsic semiconductor layer 12 can be an i-type amorphous silicon layer. The substantially intrinsic semiconductor layer 12 preferably contains hydrogen. The substantially intrinsic semiconductor layer 12 is preferably of a thickness that does not contribute substantially to the generation of electricity. The thickness of the substantially intrinsic semiconductor layer 12 can be from 3 nm to 15 nm, and is preferably from 5 nm to 10 nm.

An n-type semiconductor layer 13 with the same type of conductivity as the crystalline silicon substrate 10 is arranged on top of the second main surface 10b of the crystalline silicon substrate 10. The n-type semiconductor layer 13 can be made of an n-type amorphous silicon layer. The n-type semiconductor layer 13 preferably contains hydrogen. The thickness of the n-type semiconductor layer 13 can be from 3 nm to 25 nm, and is preferably from 5 nm to 15 nm.

A substantially intrinsic semiconductor layer 14 is arranged between the second main surface 10b of the crystalline silicon substrate 10 and the n-type semiconductor layer 13. The substantially intrinsic semiconductor layer 14 can be an i-type amorphous silicon layer. The substantially intrinsic semiconductor layer 14 is preferably of a thickness that does not contribute substantially to the generation of electricity. The substantially intrinsic semiconductor layer 14 preferably contains hydrogen. The thickness of the substantially intrinsic semiconductor layer 14 can be from 3 nm to 15 nm, and is preferably from 5 nm to 10 nm.

Transparent conductive oxide (TCO) layers 15 and 16 are arranged on the semiconductor layers 11 and 13. A p-side collector electrode 17 is arranged on the TCO layer 15. Holes are collected by the p-side collector electrode 17. Meanwhile, an n-side collector electrode 18 is arranged on the TCO layer 16. Electrons are collected by the n-side collector electrode 18.

Manufacturing Method for Solar Cell 1

The following is an explanation of an example of the manufacturing method for a solar cell 1.

First, a crystalline silicon substrate 10 is prepared. The method used to produce the crystalline silicon substrate 10 will be explained below in greater detail.

Next, substantially intrinsic semiconductor layers 12 and 14 are formed on the crystalline silicon substrate 10. The substantially intrinsic semiconductor layers 12 and 14 can be formed using a deposition method such the sputtering method or chemical vapor deposition (CVD).

Next, a p-type semiconductor layer 11 is formed on substantially intrinsic semiconductor layer 12, and an n-type semiconductor layer 13 is formed on substantially intrinsic semiconductor layer 14. The p-type semiconductor layer 11 and the n-type semiconductor layer 13 can be formed using a deposition method such the sputtering method or chemical vapor deposition (CVD).

Next, TCO layers 15 and 16 are formed on the semiconductor layers 11 and 13. The TCO layers 15 and 16 can be formed using a deposition method such the sputtering method or chemical vapor deposition (CVD).

The solar cell 1 is then completed by forming the p-side collector electrode 17 and the n-side collector electrode 18. The p-side collector electrode 17 and the n-side collector electrode 18 can be formed by applying conductive paste or by using a plating method.

Production Method for Crystalline Semiconductor Substrate 10

Figure 2:
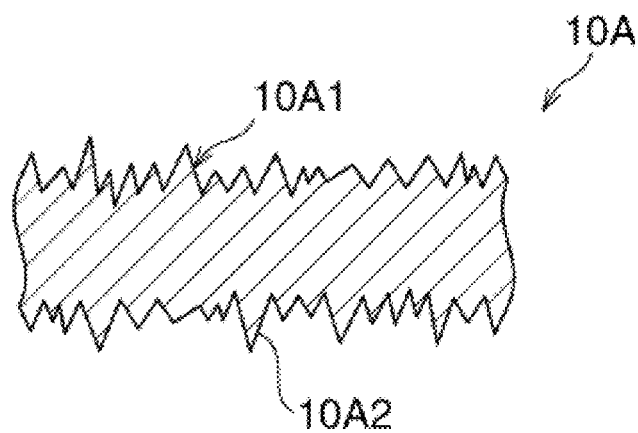
FIG. 2 is a cross-sectional view of a portion of a crystalline silicon substrate prior to etching.
Figure 3:
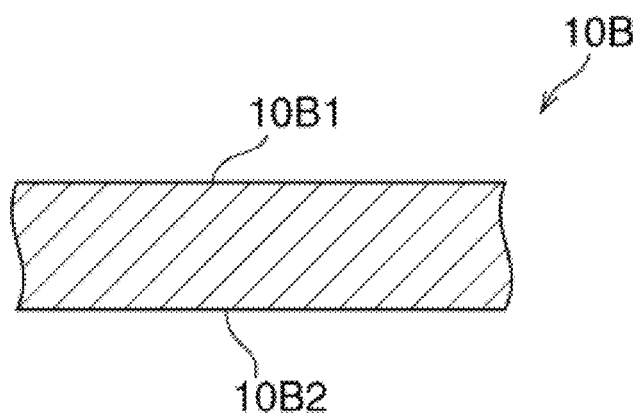
FIG. 3 is a cross-sectional view of a portion of a crystalline silicon substrate after the second etching step.
Figure 4:
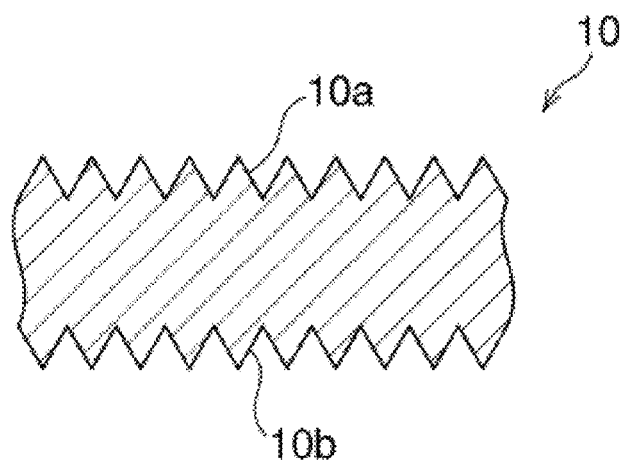
FIG. 4 is a cross-sectional view of a portion of a crystalline silicon substrate after the third etching step.

FIG. 2 is a cross-sectional view of a portion of a crystalline silicon substrate prior to etching. FIG. 3 is a cross-sectional view of a portion of a crystalline silicon substrate after the second etching step. FIG. 4 is a cross-sectional view of a portion of a crystalline silicon substrate after the third etching step.

The following is a detailed explanation of the method used to produce the crystalline silicon substrate 10 with reference primarily to FIG. 2 through FIG. 4.

First, an ingot of crystalline silicon is prepared. For example, an ingot of single-crystalline silicon is prepared when a single-crystal silicon substrate is to be produced. The ingot of crystalline silicon can be prepared using any method common in the art.

Slicing Crystalline Silicon Ingot

Next, the ingot of crystalline silicon is sliced using, for example, a wire saw. Thus, the crystalline silicon substrate 10A shown in FIG. 2 is obtained. The crystalline silicon substrate 10A is produced by cutting the ingot in this way. As a result, the main surfaces 10A1, 10A2 of the crystalline silicon substrate 10A have irregular shapes referred to as saw marks.

1st and 2nd Etching Step—Isotropic Etching

Next, the first and second etching steps are performed on the crystalline silicon substrate 10A. More specifically, in both the first and the second etching steps, the unevenness of the main surfaces 10A1 and 10A2 of the crystalline silicon substrate 10A is removed and the main surfaces 10A1 and 10A2 are substantially smoothed by immersing the crystalline silicon substrate 10A in an etching solution. This produces the crystalline silicon substrate 10B with smooth main surfaces 10B1 and 10B2 as shown in FIG. 3. The main surfaces 10B1 and 10B2 do not have to be completely smooth, but should at least have a degree of smoothness higher than main surfaces 10A1 and 10A2. The first etching step and second etching step do not have to be pure isotropic etching steps. They only have to be substantially isotropic etching steps.

More specifically, in the first etching step, isotropic etching is performed on the main surfaces 10A1 and 10A2 of the crystalline silicon substrate 10A by immersing the crystalline silicon substrate 10A in an etching solution (first etching solution). In the second etching step, isotropic etching is again performed on the main surfaces 10A1 and 10A2 of the crystalline silicon substrate 10A by immersing the crystalline silicon substrate 10A in an etching solution (second etching solution) different from the first etching solution used in the first etching step.

In the first etching step, organic matter adhering to the main surfaces 10A1 and 10A2 of the crystalline silicon substrate 10A are removed and the main surfaces 10A1 and 10A2 are smoothed to a certain degree. For this reason, the main surfaces 10A1 and 10A2 do not have to be etched with high shaping precision. In contrast, in the second etching step, the main surfaces 10A1 and 10A2 smoothed to a certain degree in the first etching step are etched to a sufficient degree of smoothness.

Therefore, the etching rate in the first etching step is relatively high, and the etching rate in the second etching step is relatively low. In this way, the amount of time required for the first and second etching steps is reduced, and the resulting crystalline silicon substrate 10B has main surfaces 10B1 and 10B2 with a high degree of smoothness.

The first etching step does not have to be performed. The second etching step may be performed alone. This can remove organic matter and smooth the main surfaces 10A1 and 10A2. However, when only the second etching step, which has a low etching rate, is performed to remove the organic matter and smooth out the main surfaces 10A1 and 10A2, the time required in the etching process to achieve the target smoothness is lengthy.

There are no particular restrictions on the first and second etching solutions as long as the crystalline silicon substrate 10A can be etched. The first and second etching solutions can be alkaline solutions, such as aqueous solutions containing sodium hydroxide and/or potassium hydroxide. The first etching solution and the second etching solution can be the same type of etching solution or different types of etching solutions.

There are no restrictions on the concentration of etching components in the first and second etching solutions (sodium hydroxide, potassium hydroxide, etc.) as long as the etching rate in the first etching step is higher than the etching rate in the second etching step. The concentration of etching components in the first etching solution may be lower than, identical to, or higher than the concentration of etching components in the second etching solution. Usually, the etching components in the first etching step more readily etch the substrate than the etching components in the second etching step. For this reason, even if the concentration of etching components in the first etching solution used in the first etching step is lower than the concentration of etching components in the second etching solution used in the second etching step, the etching rate in the first etching step is often made higher than the etching rate in the second etching step. The concentration of etching components in the first and second etching solutions can be from 2 mass % to 10 mass %.

The etching times for the first and second etching steps can be determined, as appropriate, according to the thickness of the crystalline silicon substrate 10A to be etched in each etching step. The etching time for the first etching step can be the same as the etching time for the second etching step. It can also be shorter or longer than the etching time for the second etching step. The etching time for each of the first and second etching steps can be from 1 minute to 15 minutes.

There are no particular restrictions on the temperatures at which the first and second etching steps are performed. The temperature for the first etching step can be the same as the temperature for the second etching step. It can also be higher or lower than the temperature for the second etching step. The temperature for each of the first and second etching steps can be from room temperature to 95° C.

3rd Etching Step—Anisotropic Etching

Next, the third etching step is performed on the crystalline silicon substrate 10B. The third etching step is an anisotropic etching step. The third etching step can be performed to complete a crystalline silicon substrate 10 in which the textured structure shown in FIG. 4 is formed on the main surfaces 10a and 10b. Depiction of the textured structure is omitted from the main surfaces 10a and 10b in FIG. 1.

Here, a "textured surface" is an uneven surface which is formed to suppress surface reflection and increase the amount of light absorbed by the solar cell substrate. The textured surface usually has a plurality of substantially square pyramidal protruding portions.

The anisotropic etching step utilizes a phenomenon in which, when a silicon crystal has different crystal planes, the etching rates thereof are also different. More specifically, when an alkaline aqueous solution is used as the etching solution, the etching rate is fastest for the (100) plane of the silicon crystal, and is slowest for the (111) plane. For this reason, when a (111) plane which has a slow etching rate occurs while performing the anisotropic etching step on a crystalline silicon substrate 10B in which a (100) plane is exposed, etching of the (100) plane is given priority. As a result, square pyramidal protrusions are formed by the (111) plane and a crystal plane equivalent to the (111) plane. This phenomenon forms a textured structure. The (111) plane and the crystal plane equivalent to the (111) plane are inclined 54.7° with respect to the (100) plane.

In the third etching step or anisotropic etching step, the crystalline silicon substrate 10B is etched using a third etching solution which has a higher etching component concentration than the second etching solution used in the second etching step or isotropic etching step. In the third etching step, however, the etching is performed at an etching rate that is lower than the etching rate in the second etching step. In this way, a textured structure with high shape precision can be obtained while also reducing the time required to perform both the second and third etching steps. In particular, the dimensional discrepancies between the protrusions constituting the textured structure can be reduced. As a result, a solar cell 1 with excellent output characteristics can be manufactured with greater efficiency. In other words, the time required to manufacture a solar cell 1 with excellent output characteristics can be reduced.

The reason for this is not clear, but is thought to be due to the following. The formation of a textured structure requires base points (a trigger which starts anisotropic etching due to the difference between both points). In order to form a textured structure with a uniform size, the base points have to be formed on the wafer surface at as close to the same time as possible. In other words, it is believed that the base points can be formed at the same time by smoothing out the plane in the first etching step, which is an isotropic etching step, and then forming the base points in the second etching step, which is an anisotropic etching step. When the etching rate is fast, the textured structure is formed immediately after the base points have been formed, and the time at which the anisotropic etching begins varies in the plane. However, when the etching rate is slow, even when there is a slight difference in the time at which the anisotropic etching starts there is not a significant difference in the amount of etching performed on the plane. This is believed to form a relatively uniform textured structure.

In order to manufacture the solar cell 1 with even greater efficiency, the ratio of the etching rate for the third etching solution used in the third etching step to the etching rate for the second etching solution used in the second etching step (etching rate for the third etching solution/etching rate of the second etching solution) should be in a range from 0.10 to 0.95, and is preferably from 0.50 to 0.80.

The ratio of the concentration of etching components in the third etching solution used in the third etching step to the concentration of etching components in the second etching solution used in the second etching step (concentration of etching components in the third etching solution/concentration of etching components in the second etching solution) should be in a range from 1.03 to 1.70, and is preferably from 1.10 to 1.30.

There are no particular restrictions on the method used to reduce the etching rate in the third etching step or anisotropic etching step below the etching rate in the second etching step or isotropic etching step. For example, the temperature of the etching steps can be adjusted so that the etching rate in the third etching step is lower than the etching rate in the second etching step.

An etching solution containing an additive that reduces the etching rate may also be used as the third etching solution in the third etching step, so as to reduce the etching rate in the third etching step below the etching rate in the second etching rate.

Specific examples of these additives include caprylic acid, lauric acid, 4-propyl benzoic acid (PrBA), 4-t-butyl benzoic acid (TBBA), 4-n-butyl benzoic acid (NBBA), 4-pentyl benzoic acid (PeBA), and 4-n-octyl benzene sulfonic acid (NOBS). One of these additives may be added to the second etching solution, or multiple kinds of additives may be added to the second etching solution.

There are no particular restrictions on the etching solution used in the third etching step as long as anisotropic etching can be performed on the crystalline silicon substrate 10B. Etching solutions that are preferably used in the third etching step include those containing an alkaline etching component such as an aqueous solution containing sodium hydroxide and/or potassium hydroxide, as well as those containing an additive enabling anisotropic etching. Specific examples of additives that enable anisotropic etching include caprylic acid, lauric acid, 4-propyl benzoic acid (PrBA), 4-t-butyl benzoic acid (TBBA), 4-n-butyl benzoic acid (NBBA), 4-pentyl benzoic acid (PeBA), and 4-n-octyl benzene sulfonic acid (NOBS). One or more of these additives may be used.

There are no particular restrictions on the etching time for the third etching step as long as a good textured structure can be formed. The etching time for the third etching step can be from 10 minutes to 45 minutes.

The temperature for the third etching step can be from 70° C. to 90° C.

Variation

In the present invention, there are no particular restrictions on the type of solar cell as long as a crystalline silicon substrate is used. The solar cell may be a back contact solar cell. The solar cell may also be a solar cell including a crystalline silicon substrate on which at least either a p-type dopant diffusion region or a n-type dopant diffusion region has been formed.

In the embodiment described above, the isotropic etching step was performed twice. However, the present invention is not limited to this configuration. The isotropic etching step may be performed only once or may be performed three or more times. The anisotropic etching step may also be performed two or more times.

A textured structure does not have to be formed on both main surfaces of the crystalline silicon substrate. A textured structure may be formed on only one of the main surfaces of the crystalline silicon substrate.

Test Example 1

Figure 5:
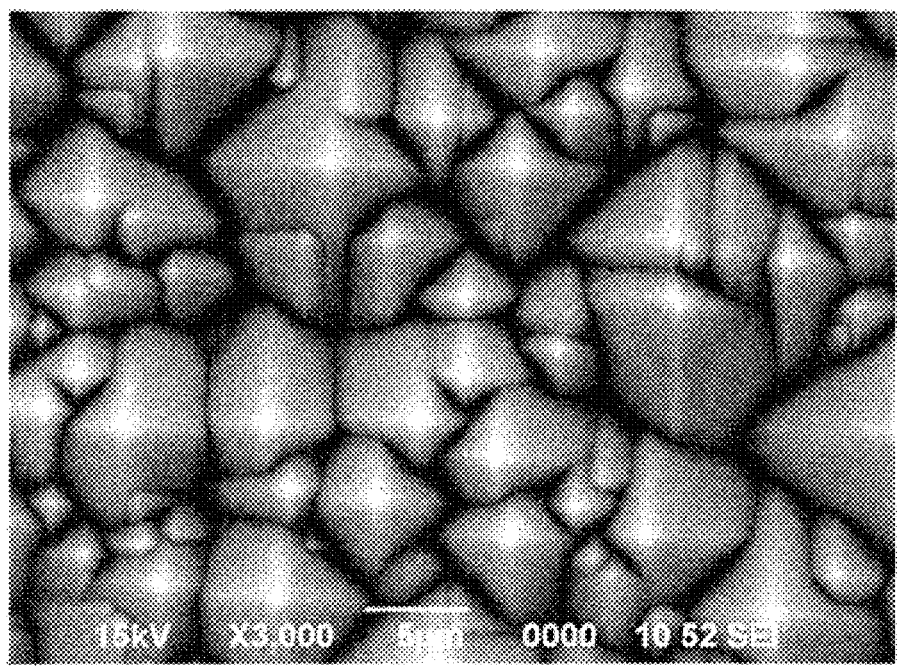
FIG. 5 is an electron micrograph of a main surface of the single-crystal silicon substrate produced in a first test example.

A single-crystal silicon substrate was obtained by slicing an ingot of single-crystal silicon using a wire saw. Next, isotropic etching was performed on the surface of the single-crystal silicon substrate under the conditions mentioned below. Afterwards, anisotropic etching was performed under the conditions mentioned below to form a textured structure. FIG. 5 is an electron micrograph of a main surface of the single-crystal silicon substrate produced in a first test example.

In the first test example, the etching rate in the isotropic etching step was 1.5 μm/min. and the amount of etching was 7 μm. The etching rate in the anisotropic etching step was 1.0 μm/min. and the amount of etching was 20 μm.

Isotropic Etching Conditions
  Etching Solution: Aqueous Solution Containing 4 mass % NaOH
  Temperature of Etching Solution: 75° C.
  Etching Time: 270 seconds
Anisotropic Etching Conditions
  Etching Solution: Aqueous Solution Containing 5 mass % NaOH and 0.05 mol/L caprylic acid
  Temperature of Etching Solution: 85° C.
  Etching Time: 1200 seconds Test Example 2

Figure 6:
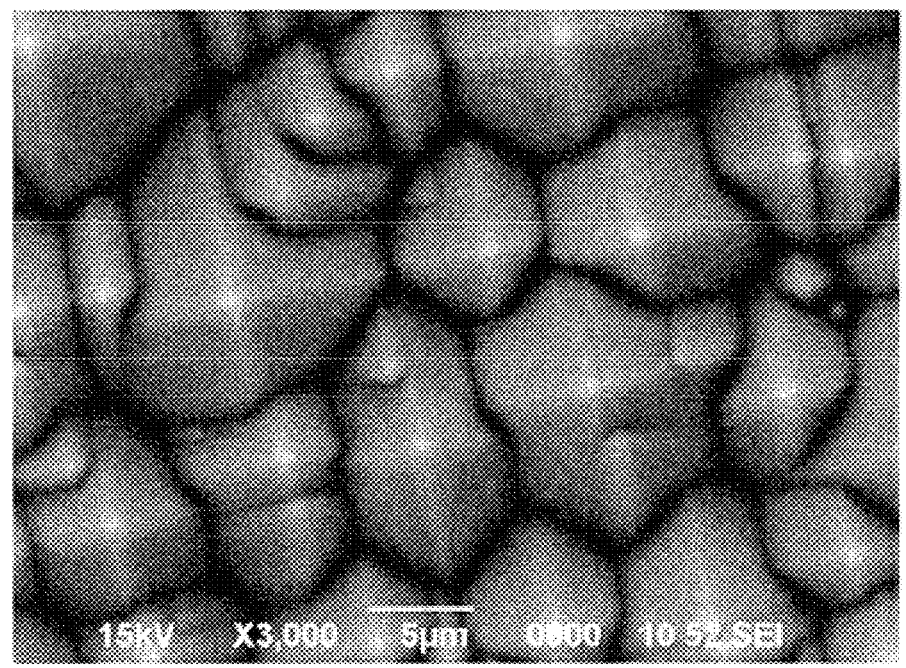
FIG. 6 is an electron micrograph of a main surface of the single-crystal silicon substrate produced in a second test example.

Isotropic etching was performed twice under the conditions mentioned below on the surface of a single-crystal silicon substrate obtained from a single-crystal silicon ingot in the same manner as the first test example. Afterwards, anisotropic etching was performed under the conditions mentioned below to form a textured structure. FIG. 6 is an electron micrograph of a main surface of the single-crystal silicon substrate produced in a second test example.

In the second test example, the etching rate in the first isotropic etching step was 6 μm/min. and the amount of etching was 13 μm. The etching rate in the second isotropic etching step was 1.5 μm/min. and the amount of etching was 7 μm. The etching rate in the anisotropic etching step was 1.0 μm/min. and the amount of etching was 20 μm.

Figure 7:
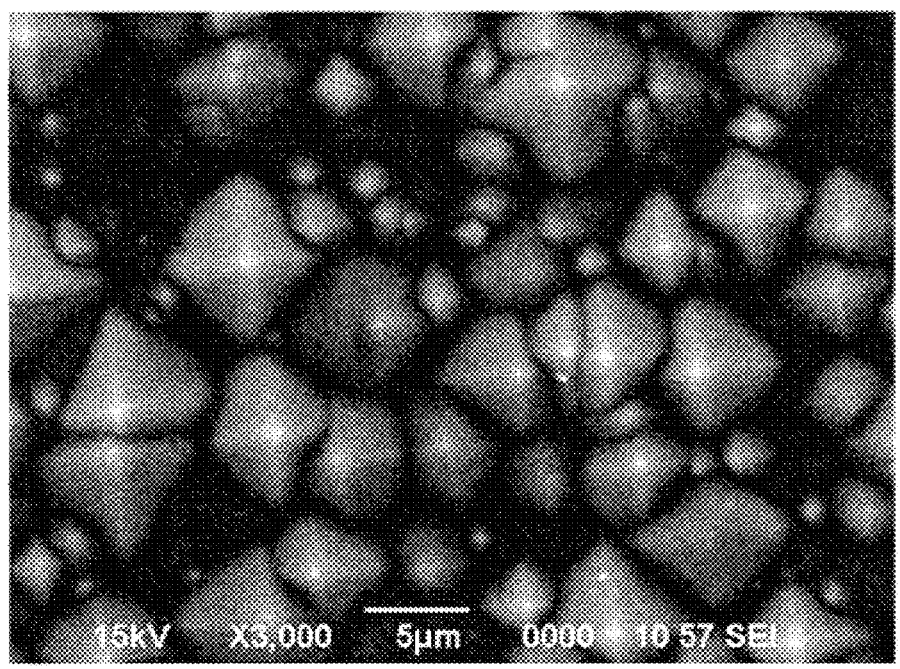
FIG. 7 is an electron micrograph of a main surface of the single-crystal silicon substrate produced in a comparative example.

1st Isotropic Etching Conditions
  Etching Solution: Aqueous Solution Containing 3 mass % NaOH
  Temperature of Etching Solution: 85° C.
  Etching Time: 130 seconds
2nd Isotropic Etching Conditions
  Etching Solution: Aqueous Solution Containing 4 mass % NaOH
  Temperature of Etching Solution: 75° C.
  Etching Time: 270 seconds
Anisotropic Etching Conditions
  Etching Solution: Aqueous Solution Containing 5 mass % NaOH and 0.05 mol/L caprylic acid
  Temperature of Etching Solution: 85° C.
  Etching Time: 1200 seconds Comparative Example A single-crystal silicon substrate was obtained by slicing an ingot of single-crystal silicon using a wire saw. Next, isotropic etching was performed on the surface of the single-crystal silicon substrate under the conditions mentioned above. Afterwards, anisotropic etching was performed under the conditions mentioned below to form a textured structure. FIG. 7 is an electron micrograph of a main surface of the single-crystal silicon substrate produced in the comparative example.

In the first test example, the etching rate in the anisotropic etching step was 1.0 μm/min. and the amount of etching was 27 μm.

Anisotropic Etching Conditions

Etching Solution: Aqueous Solution Containing 16 mass % NaOH and 0.05 mol/L caprylic acid Temperature of Etching Solution: 85° C.

Etching Time: 1620 seconds

Evaluation

As shown in the electron micrograph of a main surface of the single-crystal silicon substrate in FIG. 7, the textured structure formed in the comparative example has a small degree of unevenness. However, as shown in the electron micrographs of a main surface of single-crystal silicon substrates in FIG. 5 and FIG. 6, the textured structures formed in the first and second test examples have a larger degree of unevenness. In addition to a larger degree of unevenness, the uniformity of the degree of unevenness in these textured structures is better than that of the comparative example.

KEY TO THE DRAWINGS

1: Solar cell
10: Crystalline silicon substrate
10A: Crystalline silicon substrate prior to etching
10B: Crystalline silicon substrate after isotropic etching
10$a$: 1st main surface
10$b$: 2nd main surface
11: p-type semiconductor layer
12, 14: Substantially intrinsic semiconductor layer
13: n-type semiconductor layer
15, 16: TCO layer
17: p-side collector electrode
18: n-side collector electrode

What is claimed is:

1. A manufacturing method for a solar cell including a crystalline silicon substrate having a main surface in which a textured structure has been formed, the textured structure being formed in the main surface of the crystalline silicon substrate by etching the main surface of the crystalline silicon substrate using one etching solution, and then etching the main surface of the crystalline silicon substrate at a lower etching rate than the etching performed using the one etching solution by using another etching solution having a higher concentration of etching components than the one etching solution.

2. The manufacturing method for a solar cell according to claim 1, wherein the etching rate for the other etching solution is reduced below the etching rate for the one etching solution by using, as the other etching solution, an etching solution including an additive for reducing the etching rate.

3. The manufacturing method for a solar cell according to claim 2, wherein the other etching solution is an etching solution containing, as the additive, at least one of caprylic acid, lauric acid, 4-propyl benzoic acid, 4-t-butyl benzoic acid, 4-n-butyl benzoic acid, 4-pentyl benzoic acid, and 4-n-octyl benzene sulfonic acid.

4. The manufacturing method for a solar cell according claim 1, wherein isotropic etching is performed on the main surface of the crystalline silicon substrate using the one etching solution, and anisotropic etching is performed on the main surface of the crystalline silicon substrate using the other etching solution.

5. The manufacturing method for a solar cell according to claim 1, wherein prior to the etching performed using the one etching solution, etching is performed on the main surface of the crystalline silicon substrate at a higher etching rate than the etching performed using the one etching solution.

6. The manufacturing method for a solar cell according to claim 1, wherein alkaline etching solutions are used for both the one etching solution and the other etching solution.

7. The manufacturing method for a solar cell according to claim 6, wherein aqueous solutions containing sodium hydroxide and/or potassium hydroxide are used for both the one etching solution and the other etching solution.

8. The manufacturing method for a solar cell according to claim 1, wherein the ratio of the etching rate for the other etching solution to the etching rate for the one etching solution (etching rate for the other etching solution/etching rate of the one etching solution) is in a range from 0.10 to 0.95.

9. The manufacturing method for a solar cell according to claim 1, wherein the ratio of the concentration of etching components in the other etching solution to the concentration of etching components in the one etching solution (concentration of etching components in the other etching solution/concentration of etching components in the one etching solution) is in a range from 1.03 to 1.70.

10. The manufacturing method for a solar cell according to claim 1, wherein a single-crystal silicon substrate or polycrystalline silicon substrate is used as the crystalline silicon substrate.

* * * * *